(12) United States Patent
Shiga

(10) Patent No.: US 8,432,737 B2
(45) Date of Patent: Apr. 30, 2013

(54) NONVOLATILE SEMICONDUCTOR MEMORY DEVICE AND METHOD TESTING THE SAME

(75) Inventor: Hitoshi Shiga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 96 days.

(21) Appl. No.: 13/217,512

(22) Filed: Aug. 25, 2011

(65) Prior Publication Data

US 2012/0051134 A1    Mar. 1, 2012

(30) Foreign Application Priority Data

Aug. 30, 2010  (JP) ................................. 2010-192083

(51) Int. Cl.
*G11C 11/34*    (2006.01)
(52) U.S. Cl.
USPC ................. 365/185.09; 365/185.17; 365/200; 365/185.21; 365/196
(58) Field of Classification Search ............. 365/185.09, 365/185.17, 200, 185.21, 196
See application file for complete search history.

(56) References Cited

U.S. PATENT DOCUMENTS

| | | | |
|---|---|---|---|
| 5,602,778 A | * | 2/1997 | Futatsuya et al. ........ 365/185.09 |
| 5,606,527 A | | 2/1997 | Kwack et al. |
| 6,111,801 A | | 8/2000 | Brady |

OTHER PUBLICATIONS

Office Action issued Nov. 20, 2012 in Japanese Patent Application No. 2010-192083 (wit English translation).

* cited by examiner

*Primary Examiner* — Jason Lappas
(74) *Attorney, Agent, or Firm* — Oblon, Spivak, McClelland, Maier & Neustadt, L.L.P.

(57) ABSTRACT

When performing a word line leak test to determine a leak state of the word lines, the control circuit applies, from the voltage control circuit to the word lines connected to the memory cell array written with test pattern data, voltages corresponding to the test pattern data. Thereafter, it switches the transfer transistors to a nonconductive state, thereby setting the word lines in a floating state. After a lapse of a certain time from switching of the transfer transistors to a nonconductive state, it activates the sense amplifier circuit to perform a read operation in the memory cell array. Then it compares a result of the read operation with an expectation value corresponding to the test pattern data.

20 Claims, 12 Drawing Sheets

NONVOLATILE SEMICONDUCTOR MEMORY DEVICE AND METHOD TESTING THE SAME

CROSS REFERENCE TO RELATED APPLICATIONS

This application is based on and claims the benefit of priority from prior Japanese Patent Application No. 2010-192083, filed on Aug. 30, 2010, the entire contents of which are incorporated herein by reference.

FIELD

Embodiments described herein relate to a nonvolatile semiconductor memory device.

BACKGROUND

NAND type flash memories have been known as electrically-rewritable semiconductor memory devices that are capable of a high degree of integration. In a NAND type flash memory, a NAND cell unit is configured by a plurality of memory cells that are connected in series such that a source diffusion layer of one memory cell is shared as a drain diffusion layer of its adjoining memory cell. Both ends of the NAND cell unit are connected to a bit line and a source line respectively through select gate transistors. Such a configuration of the NAND cell unit realizes a smaller unit cell area and a larger memory capacity than those realized in a NOR type memory.

A memory cell of a NAND type flash memory includes a charge accumulation layer (a floating gate electrode) formed above a semiconductor substrate via a tunnel insulating film, and a control gate electrode stacked above the charge accumulation layer via an inter-gate insulating film, and stores data in a nonvolatile manner according to a charge accumulation state of the floating gate electrode. For example, a memory cell of a NAND type flash memory executes binary data storage in which a high threshold voltage state with charges injected in the floating gate electrode is represented by data "0" and a low threshold voltage state with charges discharged from the floating gate electrode is represented by data "1". Recent memory cells also store multi-value data such as four-value data, eight-value data, and so on, by subdividing the threshold voltage distributions to be written.

In recent years, as a minimum feature size becomes smaller, and miniaturization of a nonvolatile semiconductor memory device advances more, an interval between word lines or an interval between a word line and a select gate line becomes smaller and smaller. A smaller interval between word lines causes a word-line leak to occur more easily. Thus, it is necessary to check occurrence of word-line leak. It is desired that a nonvolatile semiconductor memory device that may detect a point of occurrence of such word-line leak.

However, in a conventional nonvolatile semiconductor memory device, it is necessary to provide a pad and switch dedicated for detection of word-line leak on a chip, which is an obstacle to reduction of chip area. In addition, it is necessary to perform detection on a word line basis or a block basis. This causes a time for detection to become longer.

DETAILED DESCRIPTION

A nonvolatile semiconductor memory device according to the embodiments is equipped with a memory cell array including a plurality of blocks arranged therein. Each of the blocks includes therein an aggregate of NAND cell units. Each of the NAND cell units includes therein memory strings, first and second select gate transistors connected to both ends of the memory string respectively. Each of the memory string includes therein a plurality of nonvolatile memory cells connected in series. Word lines are each commonly connected to control gates of the memory cells arranged along a first direction. First and second select gate lines are each commonly connected to gates of the first or second select gate transistors arranged along the first direction. Bit lines are each connected to a first end of the NAND cell unit. A source line is connected to a second end of the NAND cell unit. A sense amplifier circuit detects a potential of the bit lines to determine data stored in the memory cells. A voltage control circuit is configured to control voltages to be provided to the word lines, and the first and second select gate lines. Transfer transistors are configured to switch a connection state between the voltage control circuit and the word lines, the first select gate line, and second select gate line. A control circuit is configured to control the voltage control circuit, the transfer transistors and the sense amplifier circuit.

When performing a word line leak test to determine a leak state of the word lines, the control circuit applies, from the voltage control circuit to the word lines connected to the memory cell array written with test pattern data, voltages corresponding to the test pattern data. Thereafter, it switches the transfer transistors to a nonconductive state, thereby setting the word lines in a floating state. After a lapse of a certain time from switching of the transfer transistors to a nonconductive state, it activates the sense amplifier circuit to perform a read operation in the memory cell array. Then it compares a result of the read operation with an expectation value corresponding to the test pattern data.

A nonvolatile semiconductor memory device according to embodiments of the present invention is described with reference to the drawings in detail.

First Embodiment

Figure 1:
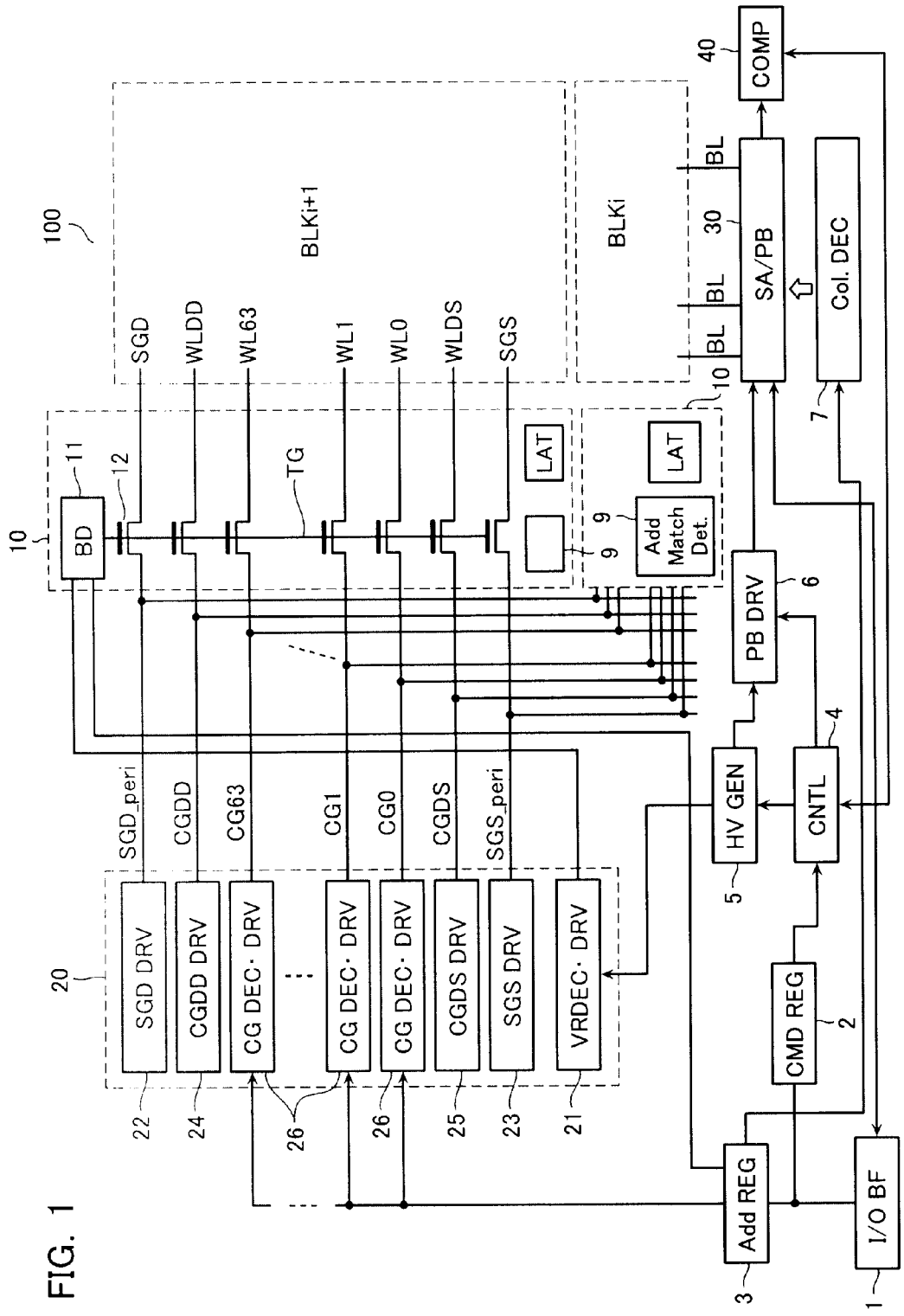
FIG. 1 is a block diagram illustrating an overall structure of the nonvolatile semiconductor memory device according to the first embodiment.

FIG. 1 is a schematic diagram of the overall structure of a NAND type flash memory as a nonvolatile semiconductor memory device according to the first embodiment.

Figure 2:
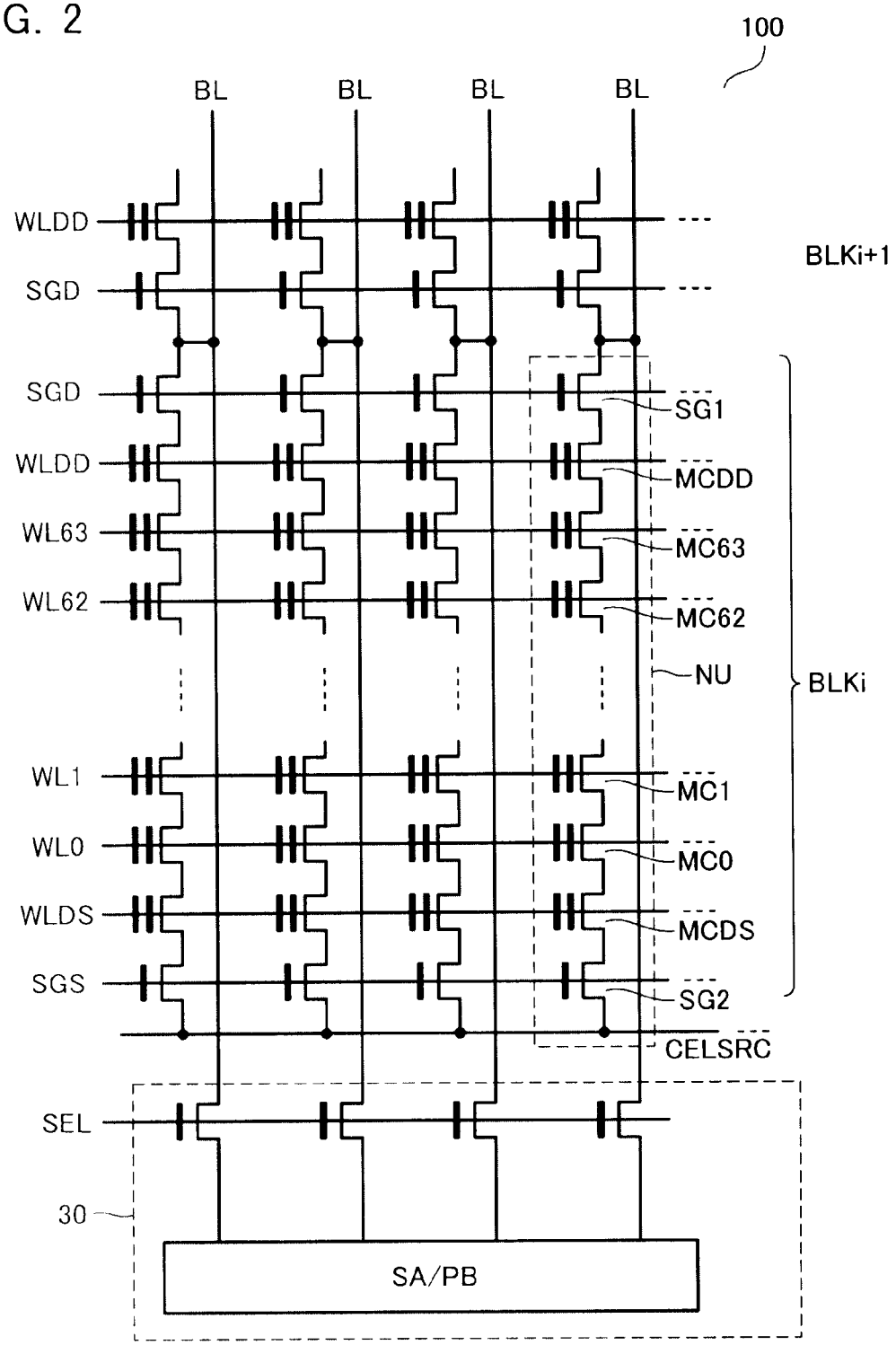
FIG. 2 is an equivalent circuit diagram of the memory cell array 100.

FIG. 2 shows an equivalent circuit of the memory cell array 100. An NAND cell unit NU is an elementary unit of the NAND type flash memory. The NAND cell unit NU comprises a memory string formed of a plurality of memory cells MC0-MC63 connected in series, and two select gate transistors SG1, SG2 located at both ends of the memory string.

However, in this embodiment, dummy cells MCDD and MCDS which do not store data are inserted adjacent to the select gate transistors SG1, SG2, respectively. The dummy cells MCDD and MCDS cannot be accessed by an input of a normal address. However, the structure of the dummy cells is similar to that of normal memory cells MC0-MC63. It is needless to say that a NAND cell unit without a dummy cell can be adopted.

The NAND cell unit NU has one end connected to a bit line BL through the select gate transistor SG1, and the other end connected to a common source line CELSRC through the select gate transistor SG2.

One memory cell has N type source/drain diffusion layers that are formed in a P type well of a silicon substrate. One memory cell has a laminated gate structure of a floating gate as a charge accumulation layer and a control gate.

However, in this embodiment, instead of a memory cell structure having a floating gate serving as a charge accumulation layer, a memory cell structure may be adopted in which an insulating layer such as a silicon nitride layer serving as a charge accumulation layer (a charge trap) is formed in the gate insulation layer.

A write operation or erase operation may change an amount of charges stored in the floating gate. This causes a threshold voltage of the memory cell to be changed, and enables a memory cell to store data of 1 bit or two or more bits.

In the embodiments described hereinbelow, a case where one memory cell stores 1-bit data is explained. It is needless to say that a similar structure or operation may be employed for a case where data of 2 bits or more is stored in one memory cell.

The memory cells MC0-MC63 and the dummy cells MCDD, MCDS in the NAND cell unit NU have respective control gates connected to separate word lines WL0-WL63, dummy word lines WLDD, WLDS, respectively. The select gate transistors SG1 and SG2 have gates connected to select gate lines SGD, SGS, respectively.

A group of the NAND cell units sharing the word lines WL0-WL63, the dummy word lines WLDD, WLDS, and the select gate line SGD, SGS forms a block BLK. A block BLK is a unit of a data erase operation at one time.

As illustrated herein, a plurality of blocks BLKi, BLKi+1, . . . are usually arranged along a direction of the bit lines. In addition, each of the blocks BLKi, BLKi+1 . . . is provided with a latch circuit LAT in a row decoder 10. The latch circuit LAT serves to store block-failure data indicating that the corresponding block is defective.

Also, the NAND type flash memory according to the present embodiment comprises, as a structure for performing an operation in the memory cell array 100, an input/output circuit 1, a command register 2, an address register 3, a control circuit 4, a high voltage generating circuit 5, a page buffer control circuit 6, a column decoder 7, a row decoder 10, a row-system voltage control circuit 20, a sense amplifier/page buffer 30 (hereinafter simply referred to as a sense amplifier circuit 30), and a comparison circuit 40.

In the write operation, a data load command is provided from the input/output circuit 1 and latched in the command register 2. In addition, a write address is latched in the address register 3 through the input/output circuit 1. Subsequently, write data is loaded to the sense amplifier circuit (it also serves as a write circuit) 30 through the input/output circuit 1. Thereafter, when a write execute command is latched in the command register 2 through the input/output circuit 1, a write operation is started automatically in the semiconductor memory device.

That is, the control circuit 4 starts the operation when the write execute command is provided thereto. The control circuit 4 performs a control of voltages that are necessary for a write operation, and performs timing control of a write pulse application operation and a verify read operation.

Also, the control circuit 4 performs a control for repetition of a write pulse application operation and a verify read operation until it is judged by the verify read operation that a desired write operation is completed.

The high voltage generating circuit 5 is controlled by the control circuit 4, and generates a high voltage (a boosted voltage) that is necessary for the row-system voltage control circuit 20 and a page buffer control circuit 6.

The row-system voltage control circuit 20 has 64 sets of CG decoder/driver 26, an SGD driver 22, an SGS driver 23, a CGDD driver 24, a CGDS driver 25, and a VRDEC driver 21. The CG decoder/driver 26 controls a voltages of the word line WL0-63 based on the boosted voltage supplied from the high voltage generating circuit 5. The SGD driver 22 controls a voltage of the drain-side select gate line SGD. The SGS driver 23 controls a voltage of the source-side select gate line SGS. The CGDD/CGDS drivers 24 and 25 control voltages of the dummy word lines WLDD and WLDS. The VRDEC driver 21 serves to output a boosted power supply voltage VRDEC for a block decoder. It is preferable that these drivers 21-26 are shared by a plurality of blocks in memory cell array 100.

It is necessary to operate a NAND type flash memory such that various types of voltages are applied to a plurality of word lines in the selected NAND cell unit. Accordingly, a page address for selecting a word line in the NAND cell unit, which is included in row address data, is input to each of the CG decoder/drivers 26.

A row decoder 10 in a narrow sense that has a function of selecting a block is arranged at the end of the word lines of each block in the memory cell array 100. The row decoder 10 includes the above-mentioned latch circuit LAT. In addition, it includes a block decoder 11, plural transfer transistors 12, and address match detection circuit 9. The block decoder 11 receives block address data from the address registor 3, and decodes it. The transfer transistors 12 are commonly controlled by the output signal of the block decoder 11, and transmits voltages necessary for a write operation, an erase operation, and a read operation, to the word lines WL, the select gate lines SGD and SGS in the selected block BLK.

The block decoder 11 includes a level shift circuit for outputting a desired voltage to a common gate TG of the transfer transistors 12. The address match detection circuit 9 is a circuit for detecting a match between the block-failure data and the designated block address data.

One end of each of the transfer transistors 12 is connected to an output terminal of the respective drivers 21-26. The other end of each of the transfer transistors 12 is connected to the word lines WL, the dummy word line WLDD, WLDS or the select gate line SGD, SGD in the memory cell array 100. For example, in the write pulse application operation, the selected word line is required to be provided with a write voltage Vpgm (around 20V). In this case, the common gate TG of the transfer transistors 12 is applied with a voltage of Vpgm+Vt (Vt is a threshold voltage of the transfer transistors 12) that is supplied from the VRDEC driver 21.

The NAND type flash memory uses an FN tunneling current for a write operation and an erase operation. Especially, in the write operation, a current necessary for a shift of the threshold voltage of one memory cell is very small, unlike in an NOR-type memory cell. Accordingly, many memory cells may be programmed at the same time. Because of this, a page length that may be processed at a time as a unit in a write operation or read operation may be enlarged up to 2 kByte or 4 kByte, for example. The number of sense units in the sense amplifier circuit 30 comprising a page buffer is in compliance with the page length.

When write data is loaded, the column decoder 7 decodes a column address sent from the address register 3, connects a selected sense unit to the input/output circuit 1, and sets write data for the column address in the sense amplifier circuit 30. To the contrary, in a read operation, the column decoder 7 outputs data read to the page buffer 30 at a time from a selected sense unit to the input/output circuit 1, based on the column address.

Although not shown in FIG. 1, a circuit for realizing data input/output at a certain cycle is incorporated between the input/output circuit 1 and the page buffer 30. As described above, the dummy word lines WLDD and WLDS are not selected or accessed like the normal word lines WL0-63. Thus, the drivers 26 for driving the word lines WL in the row-system voltage control circuit 20 are different from the drivers 25 and 26 for driving the dummy word lines WLDD and WLDS in that the former basically includes a decoder for decoding a word line address comprising 5 bits or 6 bits, while the latter does not include such decoders.

The comparison circuit 40 compares a read result of a word line leak test described below with the leak test pattern data written in the memory cell array 100 to judge presence or absence of the word line leak. This embodiment is configured to perform a word line leak test for testing a leak state of the word lines WL.

Figure 3A:
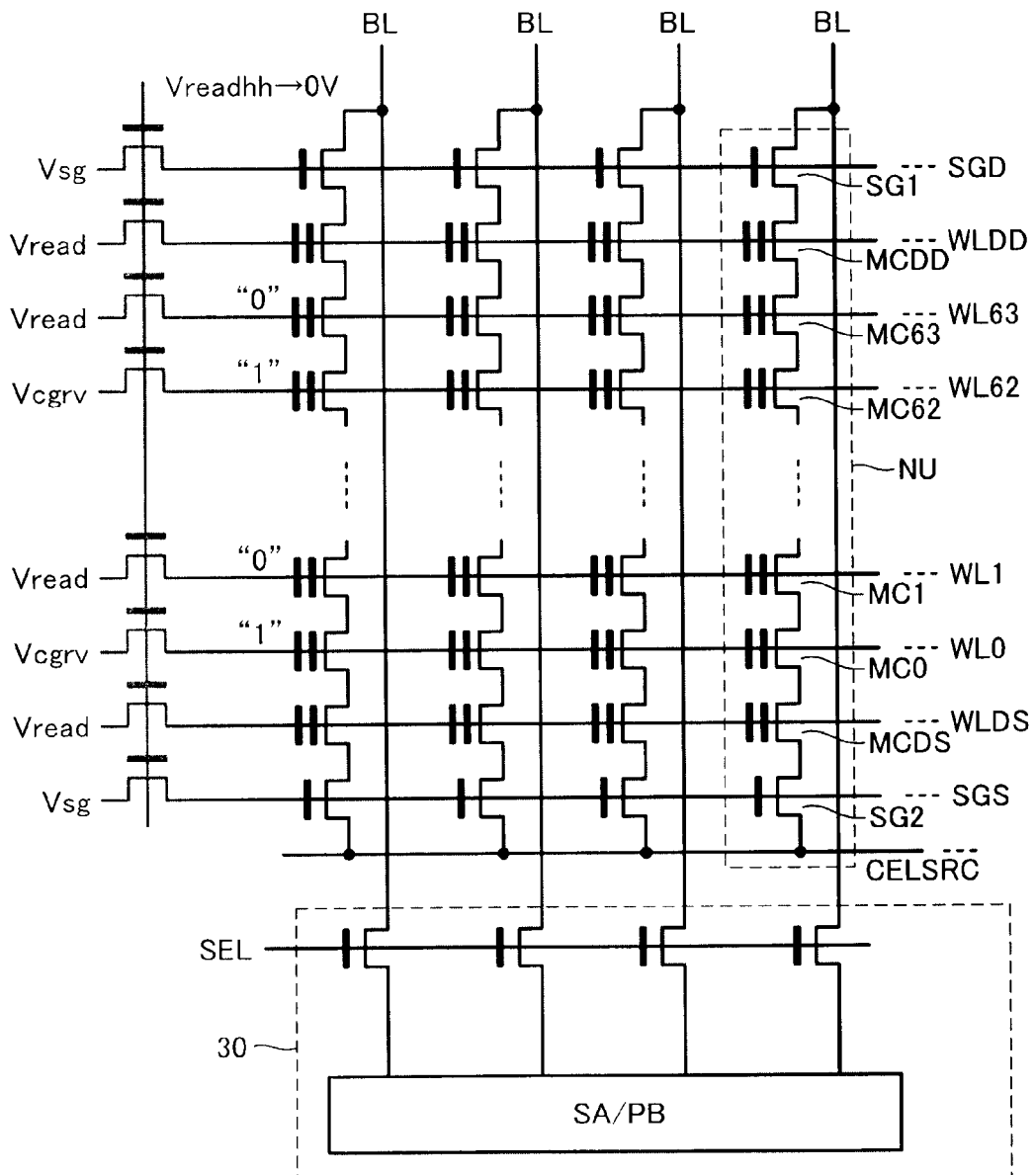
FIG. 3A is a schematic diagram illustrating an operation of the nonvolatile semiconductor memory device according to the first embodiment.
Figure 3B:
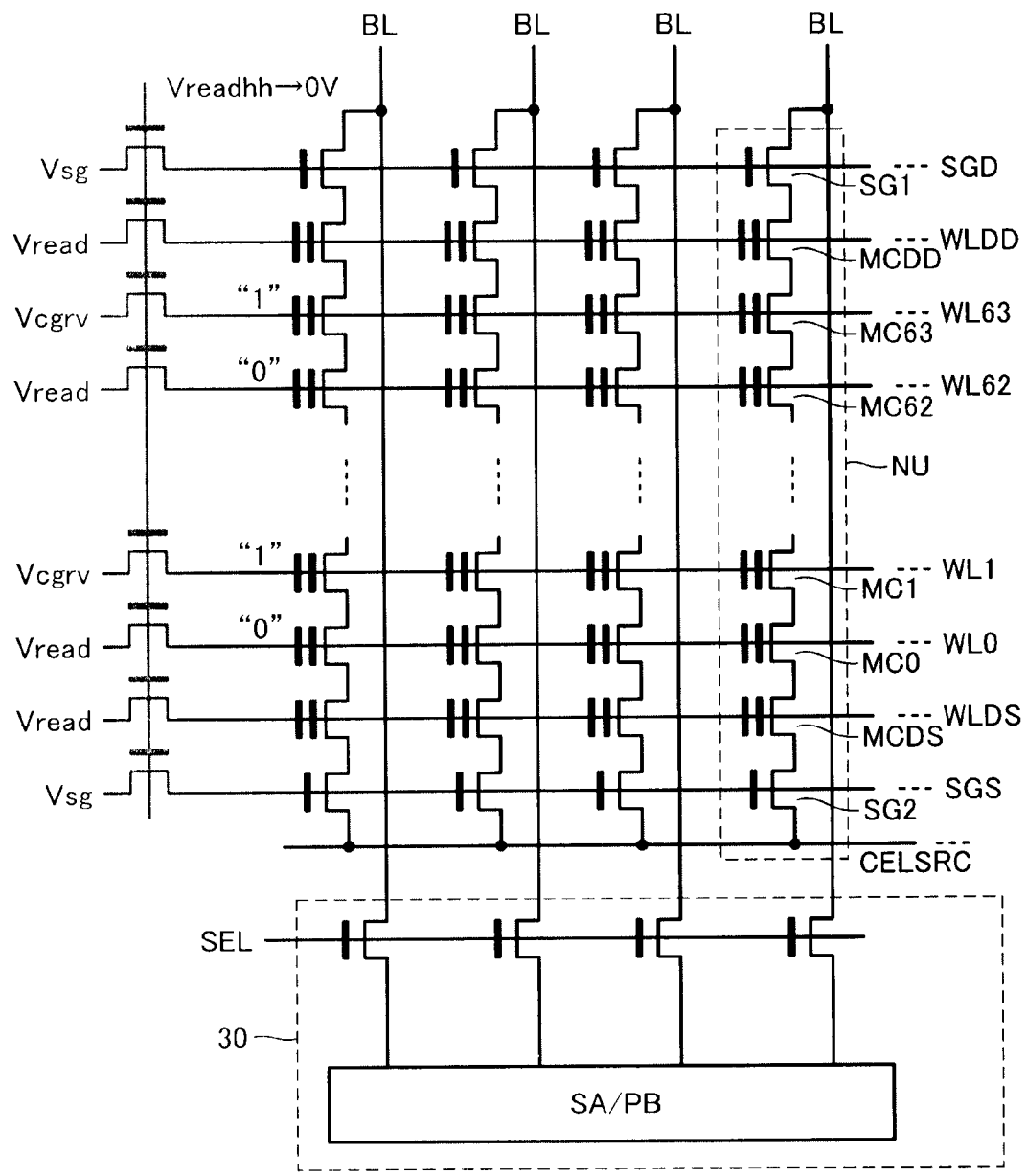
FIG. 3B is a schematic diagram illustrating an operation of the nonvolatile semiconductor memory device according to the first embodiment.
Figure 4A:
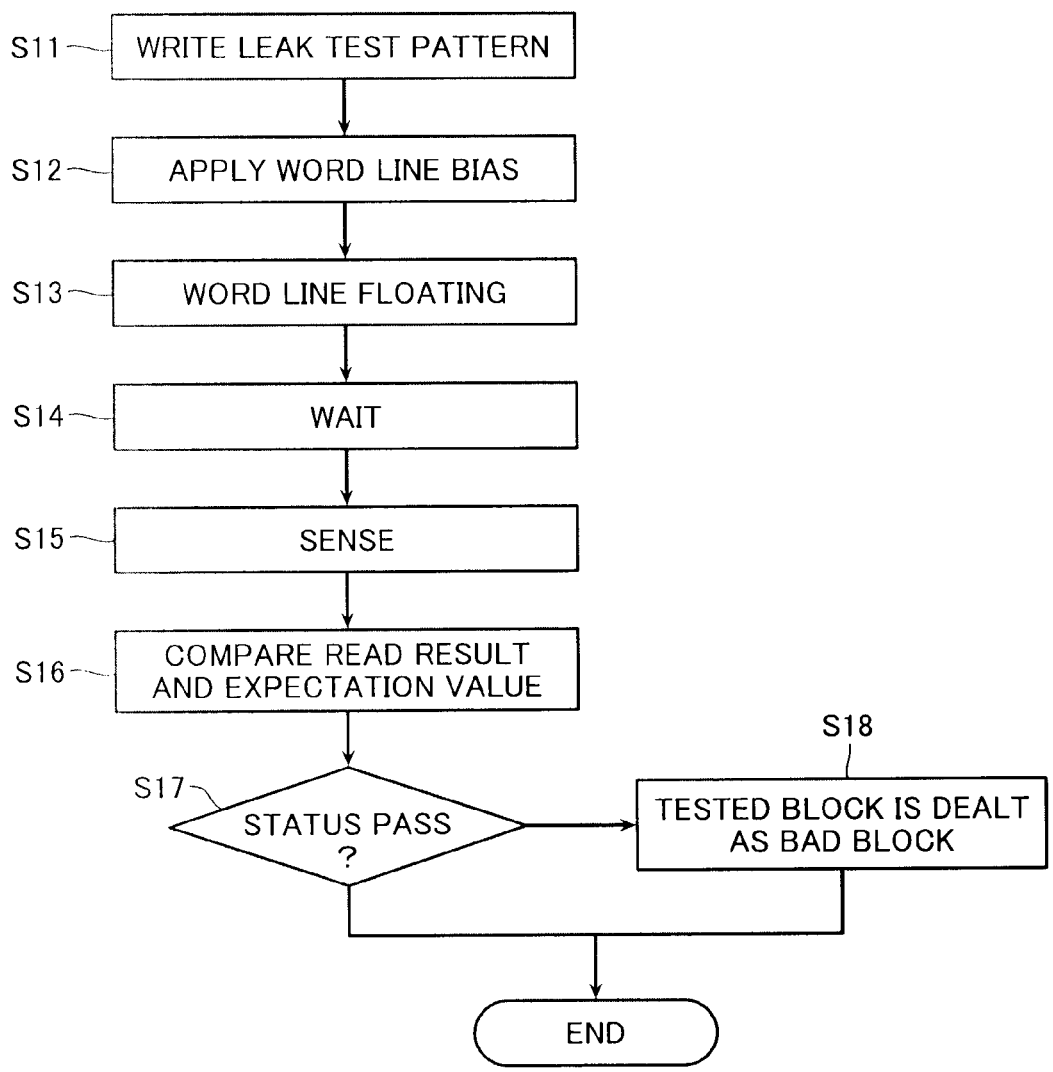
FIG. 4A is a flow chart illustrating an operation of the nonvolatile semiconductor memory device according to the first embodiment.
Figure 4B:
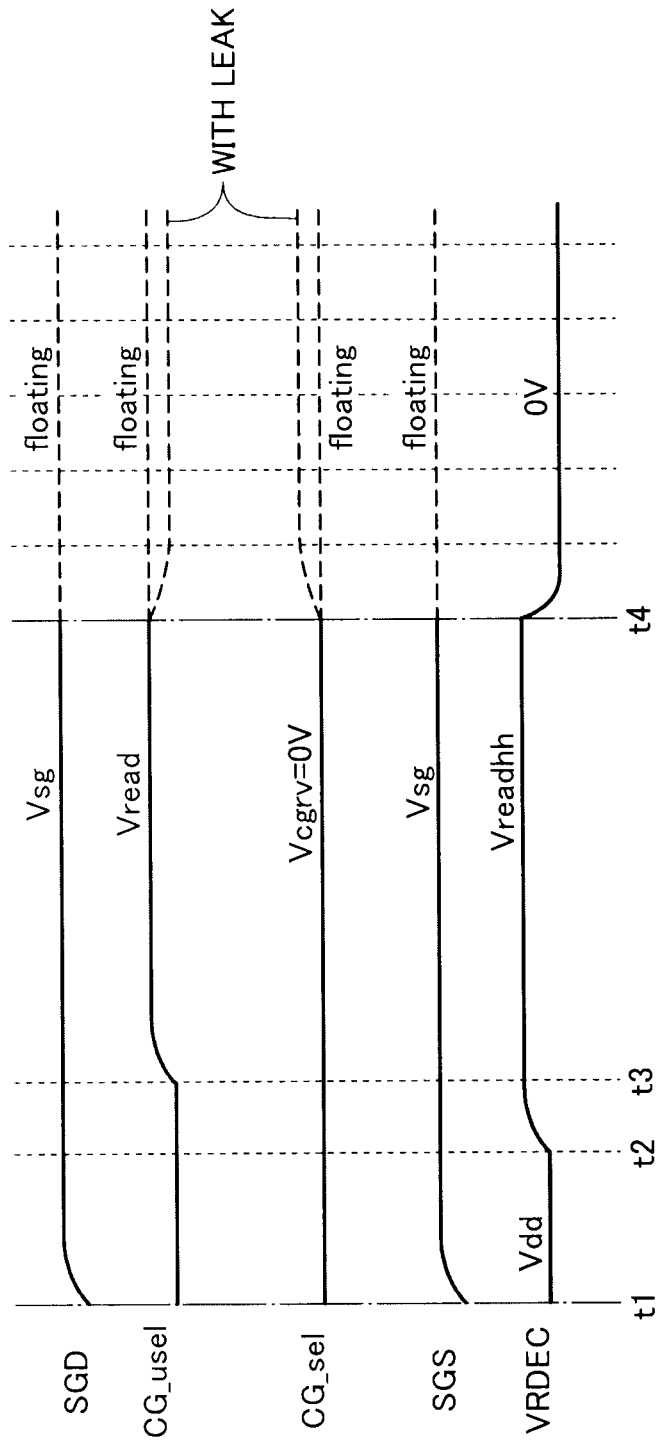
FIG. 4B is a timing chart illustrating an operation of the nonvolatile semiconductor memory device according to the first embodiment.
Figure 5:
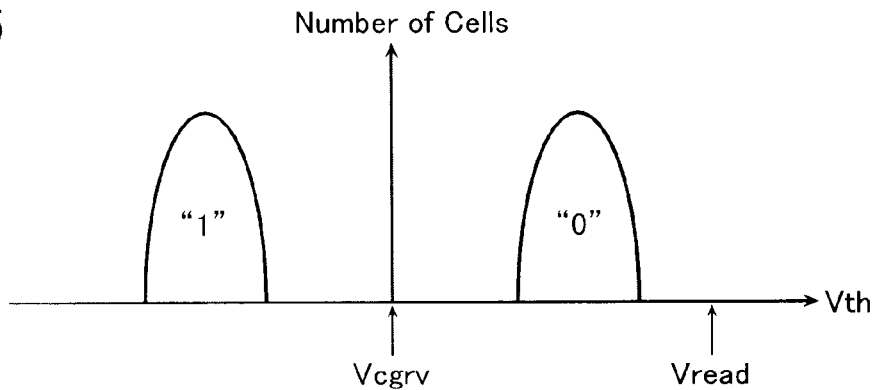
FIG. 5 is a schematic diagram illustrating an operation of the nonvolatile semiconductor memory device according to the first embodiment.
Figure 6:
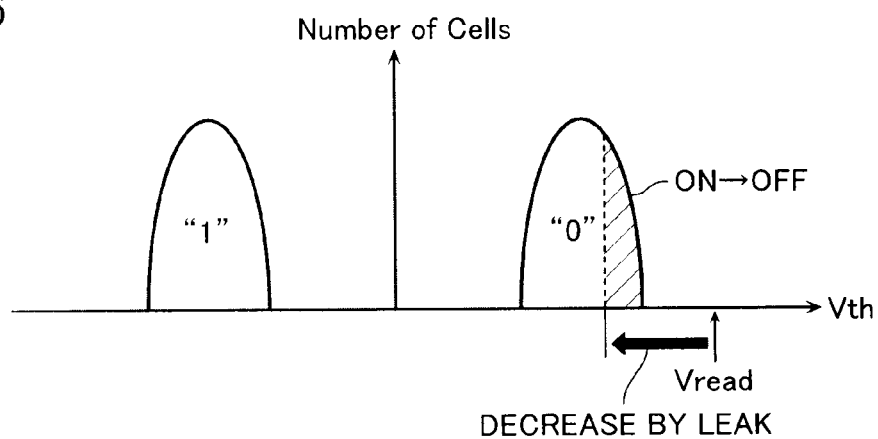
FIG. 6 is a schematic diagram illustrating an operation of the nonvolatile semiconductor memory device according to the first embodiment.

Next, an operation of the NAND type flash memory of the present embodiment when a word line leak test is performed is described with reference to FIG. 3A to FIG. 6. FIG. 3A and FIG. 3B show relations between the test pattern data stored in the memory cells and voltages applied thereto when a word line leak test is performed. FIG. 4A is a flow chart illustrating an execution procedures of this word line leak test. FIG. 4B is a timing chart illustrating an operation of this word line leak test. FIG. 5 and FIG. 6 show relations between voltages applied to the word lines WL and the threshold voltage distributions of the memory cells. With reference to FIG. 3A, FIGS. 3B, and 4A, FIG. 4B, an operation of the word line leak test according to this embodiment is described. The word line leak test of the present embodiment is performed by two steps as shown in FIGS. 3A and 3B. One of the two steps (FIG. 3A) performs the word line leak test for odd-numbered word lines in one memory block BLK. The other step (FIG. 3B) performs the word line leak test for even-numbered word lines. In either of the two steps, the word lines WL and the like are charged to a certain potential, and then they are set in a floating state. Thereafter, a leak state of the word lines WL is judged by operating the sense amplifier circuit after a lapse of a certain period. The leak state of all of the word lines in the memory blocks BLK may be judged by executing these two steps.

The leak test for odd-numbered word lines is started after writing test pattern data (checker pattern data) to the memory cells. That is, odd-numbered memory cells MC (MC1, MC3, ... MC63) in the NAND cell unit NU, the number being counted from the bit line BL side, are provided with data "0", while even-numbered memory cells MC are provided with data "1", as shown in FIG. 3A (Step S11 of FIG. 4). In the following description, "odd-numbered memory cells" and "even-numbered memory cells" mean memory cells counted from the bit line BL side unless otherwise specified.

A read pass voltage Vread is applied to the odd-numbered word lines WL connected to the memory cells MC provided with data "0". As shown in FIG. 5, the read pass voltage Vread is a voltage larger by about 2 V than the upper limit of the threshold voltage distribution of the memory cells MC having data "0" given as the test pattern data. For example, in a binary memory scheme, the read pass voltage Vread is about 6 V.

On the other hand, the even-numbered word lines WL connected to the memory cells MC having data "1" is provided with the voltage Vcgrv. The voltage Vcgrv is an intermediate voltage between the threshold voltage distributions of data "1" and "0", as shown in FIG. 5. For example, it is set at 0 V.

Note that, the dummy word lines WLDD, WLDS, and the select gate lines SGD, SGS are fixedly provided with the read pass voltage Vread, the read pass voltage Vread, the select gate voltage Vsg, the select gate voltage Vsg, respectively, from row-system voltage control circuit 20.

Note that it is preferable that the upper limit of the threshold voltage distribution of the memory cells MC corresponding to data "0" of the test pattern data is changed depending on the determination criterion of the word line leak test. By controlling the upper limit, it is possible to determine how much leak is judged as a defect.

The NAND type flash memory according to the present embodiment generates above-mentioned voltages in the row-system voltage control circuit 20 when a word line leak test is performed. These voltages are applied to the word lines WL, the dummy word lines WLDD, WLDS, and the select gate lines SGD, SGS through the transfer transistors 12 (Step S12 of FIG. 4). In order to transfer these voltages, the voltage VRDEC given at the gate TG of the transfer transistors 12 is maintained at a voltage Vtg during a certain period. Here, the voltage Vtg is set at a voltage Vreadhh which is equal to the voltage Vread added by a threshold voltage Vth of the transfer transistor 12 (=Vread+Vth), or a value larger than this.

In the word line leak test according to the present embodiment, the voltage VRDEC is kept at the voltage Vreadhh during a certain period. This allows the above-mentioned voltages generated in the row-system voltage control circuit 20 to be transferred to the word lines WL, the dummy word lines WLDD, WLDS and the select gate lines SGD, SGS. Then, the voltage VRDEC is dropped from the voltage Vreadhh to 0 V. This allows the word lines WL, the dummy word lines WLDD, WLDS and the select gate lines SGD, SGS to become a floating state (Step S13 of FIG. 4).

After these lines are set in a floating state, the control circuit 4 operates the sense amplifier circuit 30 after a lapse of a certain wait time (for example, about 10 uS) to detect an electric potential of the bit lines BL (steps S14 and S15 of FIG. 4).

Even if being set in a floating state, the potentials of the word lines WL are almost kept at an original value, if there is smaller leak in the word lines WL than expected. Thus, all of the memory cells MC0-63 in the NAND cell unit maintains a conductive state, thereby allowing the bit line BL connected to the NAND cell unit to be discharged. Accordingly, if leak of the word lines WL is sufficiently small in view of the above-described wait time, the data read from the sense amplifier circuit 30 becomes all "L" for all of the bit lines BL in the block BLK.

On the other hand, if leak of the word lines WL is large, a voltage value the voltage Vread of the word lines WL decreases from an original value (To the contrary, the potential of the word line WL provided with the voltage Vcgrv rises). As a result, for example, some of the memory cells that store data "0" switch from a conductive state (ON) to a non-conductive state (OFF), as shown in FIG. 6. This prevents some of the bit lines BL connected to such the NAND cell units from being discharged, allowing them to be kept in a certain potential. Regarding the bit lines BL that are kept at the certain potential, data read into the sense amplifier circuit 30 is "H". This means that a leak has occurred.

The sense amplifier circuit 30 detects a change in potential of the bit lines BL, and stores read data in a page buffer in the sense amplifier circuit 30. The read data indicates whether or not leak in the word lines exists. The comparison circuit 40 determines whether the read data stored in the page buffer is AllFFh or All00h. The comparison circuit 40 judges a degree of leak of the odd-numbered word lines WL in the memory blocks BLK depending on the result of the comparison.

While procedures of the leak test for judging the degree of the leak in the odd-numbered word lines WL in the memory blocks BLK has been explained with reference to FIG. 3A, a degree of leak in the even-numbered word lines WL may be tested in substantially the same way as those of the odd-numbered word lines WL. That is, as shown in FIG. 3B, a leak test for even-numbered word lines is started after writing data "1" to the odd-numbered memory cells MC, while writing data "0" to the even-numbered memory cells MC.

The even-numbered word lines WL connected to the memory cells MC having data "0" are applied with the read-pass voltage Vread. On the other hand, the odd-numbered word lines WL connected to the memory cells MC having data "1" are applied with the read voltage Vcgrv. Voltages applied to the dummy word lines WLDD, WLDS and the select gate lines SGD, SGS are the same as those of FIG. 3A. Similar to FIG. 3A, after the transfer transistors 12 are rendered conductive for a certain period, they are switched to a non-conductive state. This causes the word lines WL and the like to be in a floating state. After a lapse of a certain wait time (for example, about 10 µS), the sense amplifier circuit 30 is activated. In this way, the degree of leak in the even-numbered word lines WL is judged.

Based on the result of the judgment on the degree of the leak according to the above-described procedures, the corresponding block BLK is judged whether it is defective or not (step S17 of FIG. 4). In this explanation, it is judged whether the number of the bit line BL (i.e., a defective bit number) judged as "H" in one page is not more than a predetermined value.

When it is judged that the number is not less than the predetermined number, the block BLK is judged as a defective block (a bad block).

The latch circuit LAT provided in the bad block BLK stores block defective data that indicates that the block is defective. The block defective data is also stored in the address match detection circuit 9. This prevents the defective block from being selected.

FIG. 4B is a timing chart that illustrates timing of application of specific voltages, and timing of change in voltage. At time t1, the select gate lines SGD and SGS are boosted to the voltage Vsg. Next, at time t2, the voltage VRDEC rises to the voltage Vreadhh. Subsequently, at time t3, word lines WL (CG_usel) connected to the memory cells MC provided with data "0" are applied with the voltage Vread. On the other hand, word line WL (CG_sel) connected to memory cell MC given data "1" is maintained to the voltage Vcgrv=0.

Then, the voltage VRDEC is dropped to 0V at time t4. The sense amplifier circuit 30 is activated after a lapse of a certain time (for example, about 10 µS) from time t4, and the sense amplifier circuit 30 executes a sensing operation. This allows the degree of leak of the word lines WL to be judged. Although illustration thereof is omitted in FIG. 4B, it is preferable that the charging operation in the bit lines BL is completed before time t4, i.e., before the word lines WL and the like are switched to a floating state.

Figure 7:
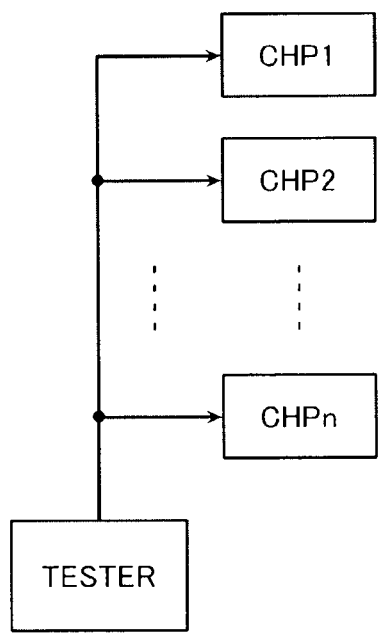
FIG. 7 is a schematic diagram illustrating an operation of the nonvolatile semiconductor memory device according to the first embodiment.

The operation of the word line leak test explained with reference to FIG. 3A-FIG. 6 may be applied to a case where a plurality of memory chips are selected as objects of the test at the same time under a control of a tester as shown in FIG. 7. That is, the tester TESTER transmits to each of the memory chips an execution command for instructing an execution of the above-mentioned word line leak test, causing each of the memory chips to conduct the above-described operation. Also, the length of the wait time in step S14 may be instructed by the tester.

Second Embodiment

Figure 8A:
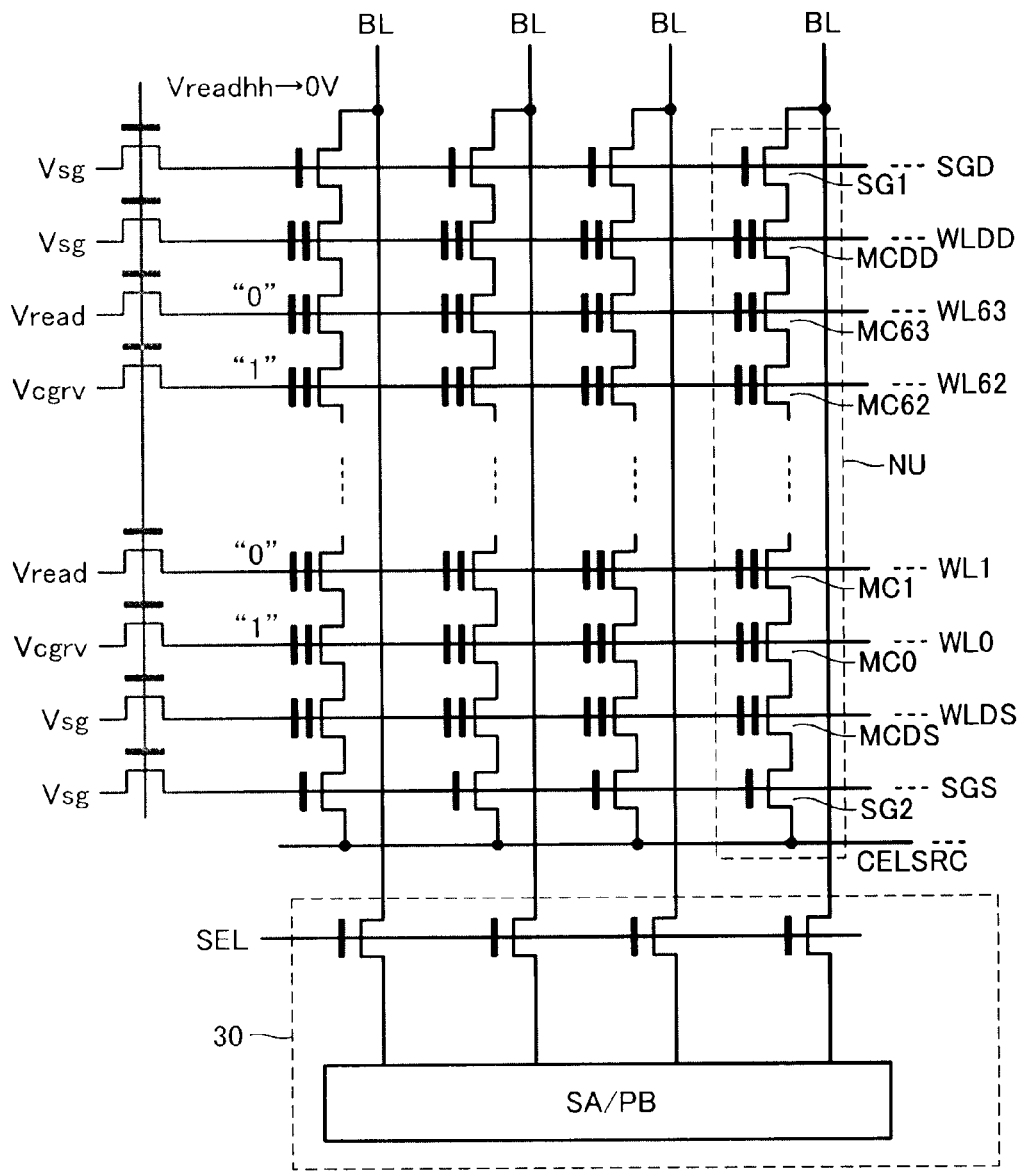
FIG. 8A is a schematic diagram illustrating an operation of the nonvolatile semiconductor memory device according to the second embodiment.
Figure 8B:
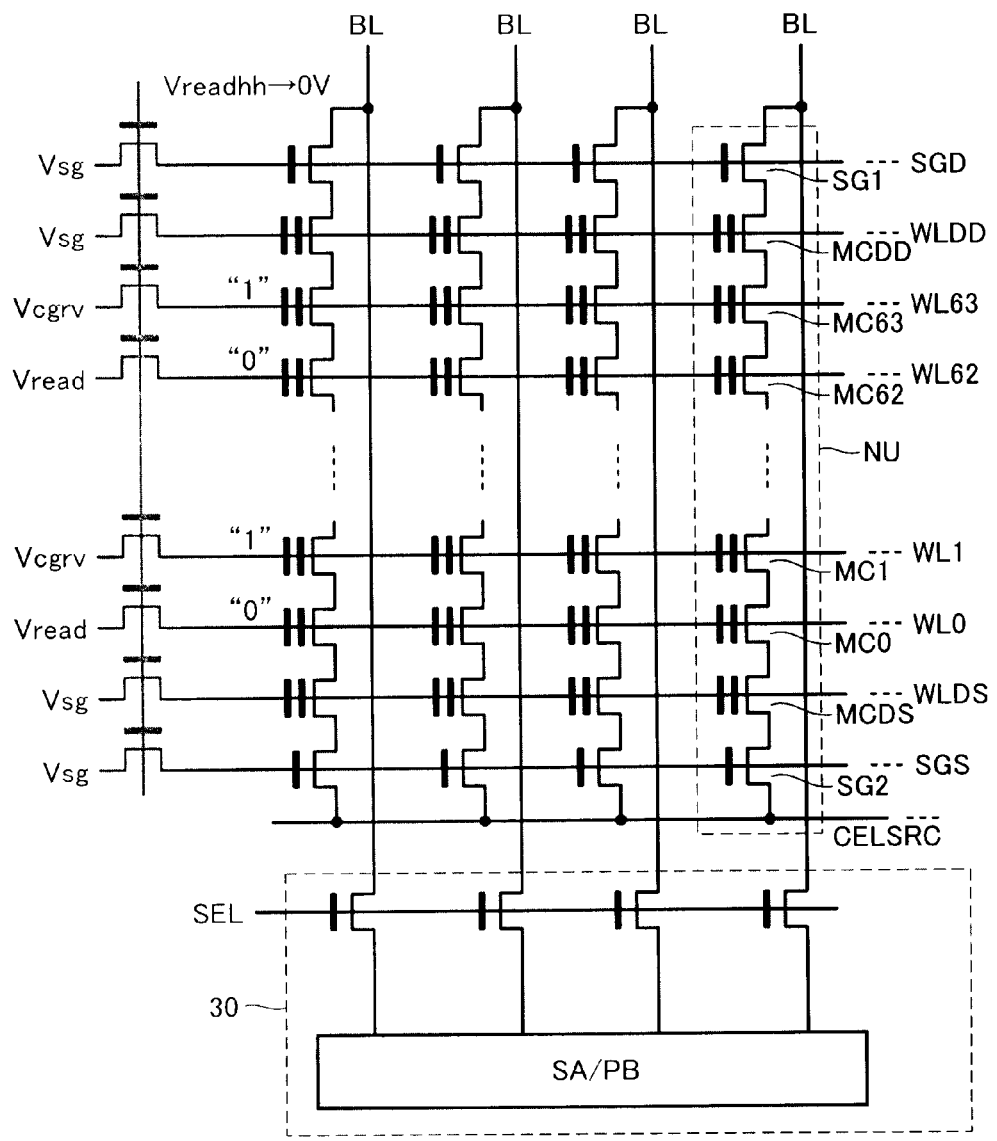
FIG. 8B is a schematic diagram illustrating an operation of the nonvolatile semiconductor memory device according to the second embodiment.

Then, a NAND type flash memory according to the second embodiment is described with reference to FIGS. 8A and 8B. Since the entire structure of the memory is the same as that shown in FIG. 1, the explanation thereof is omitted here. FIG. 8A and FIG. 8B show relationship of test pattern data and voltages when the word line leak test is performed in the NAND flash memory according to the second embodiment. Since the entire structure of the memory is the same as that shown in FIG. 1, the explanation thereof is omitted here. FIG. 8A and FIG. 8B show relationship of test pattern data and voltages when the word line leak test is performed in the NAND flash memory according to the second embodiment. In this embodiment, a voltage applied to the dummy word lines WLDD and WLDS is the voltage Vsg, rather than the voltage Vread. This is different from the first embodiment. Since the operation thereof is similar to that of the first embodiment in other aspects, duplicate explanation is omitted here. A voltage provided to the dummy word lines does not need to be the voltage Vread, and the voltage Vsg is enough, as long as threshold voltages of the dummy cells MCDD and MCDS are kept at negative values, for example.

Third Embodiment

Figure 9A:
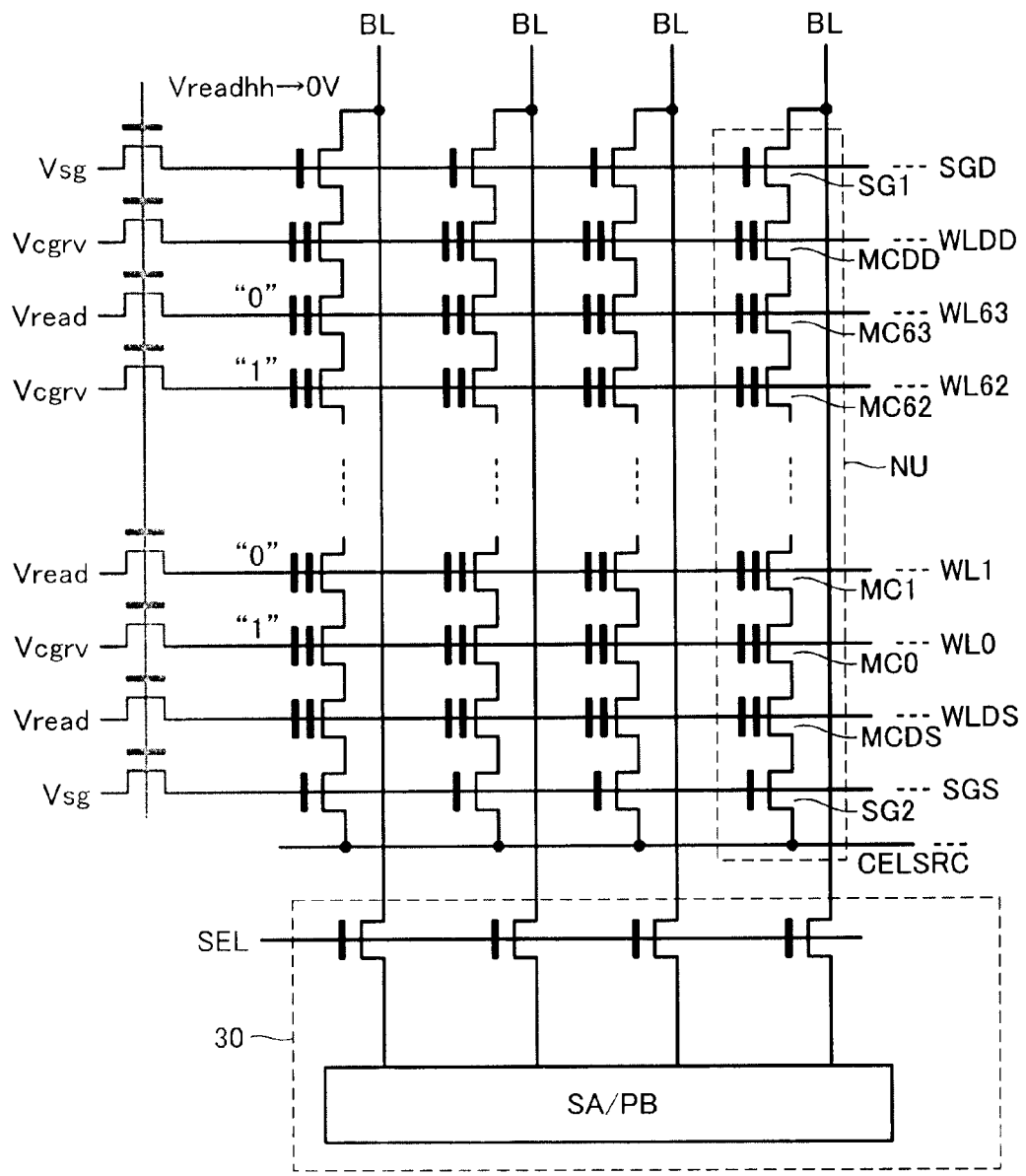
FIG. 9A is a schematic diagram illustrating an operation of the nonvolatile semiconductor memory device according to the third embodiment.

Next, an NAND type flash memory according to the third embodiment is described with reference to FIGS. 9A and 9B. Since the entire structure of the memory is the same as that shown in FIG. 1, the explanation thereof is omitted here. FIG.

Figure 9B:
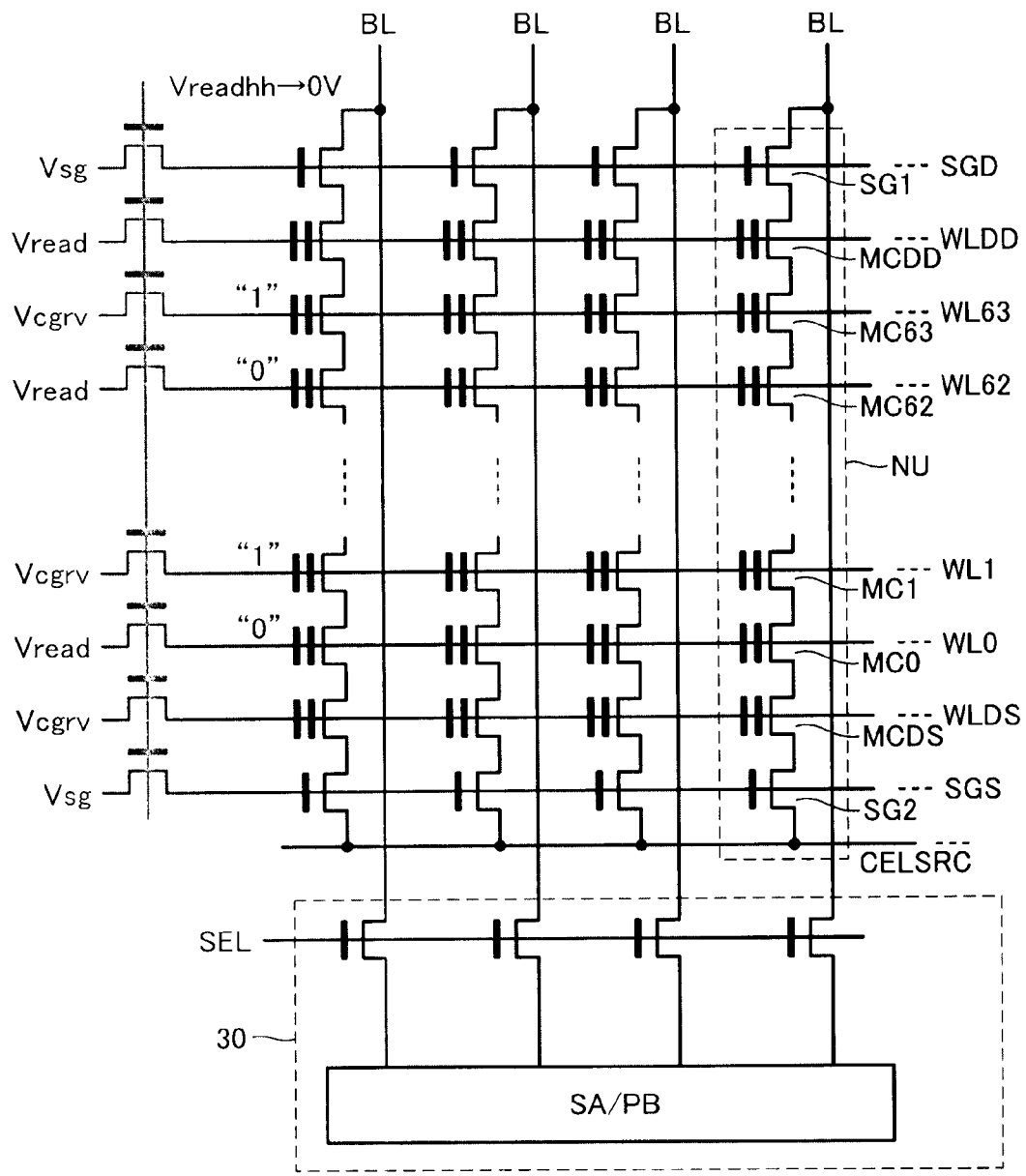
FIG. 9B is a schematic diagram illustrating an operation of the nonvolatile semiconductor memory device according to the third embodiment.

9A and FIG. 9B show relationship of test pattern data and voltages when the word line leak test is performed in the NAND flash memory according to the second embodiment. FIG. 9A and FIG. 9B corresponds to FIG. 3A and FIG. 3B, respectively.

In this embodiment, voltages applied to the dummy word lines WLDD, WLDS is set to be different from those applied to the adjacent word lines WL. For example, as shown in FIG. 9A, when the voltage applied to the word line WL63 is the voltage Vread, the voltage Vcgrv is applied to the adjacent dummy word line WLDD. In this case, the voltage Vread is applied to the dummy word line WLDS, because the voltage Vcgrv is applied to the word line WL0. Because of this, the voltage Vread and the voltage Vcgrv are applied to the word line WL and the dummy word lines WLDD, WLDS in an alternate manner. Applying voltages in this way may cause detection of a leak state to become easier.

In contrast, as shown in FIG. 9B, the voltage Vread is applied to the dummy word line WLDD, when the voltage applied to the word line WL63 is the voltage Vcgrv. In this case, since the voltage Vread is applied to the word line WL0, the voltage Vcgrv is applied to the dummy word line WLDS.

Fourth Embodiment

Figure 10:
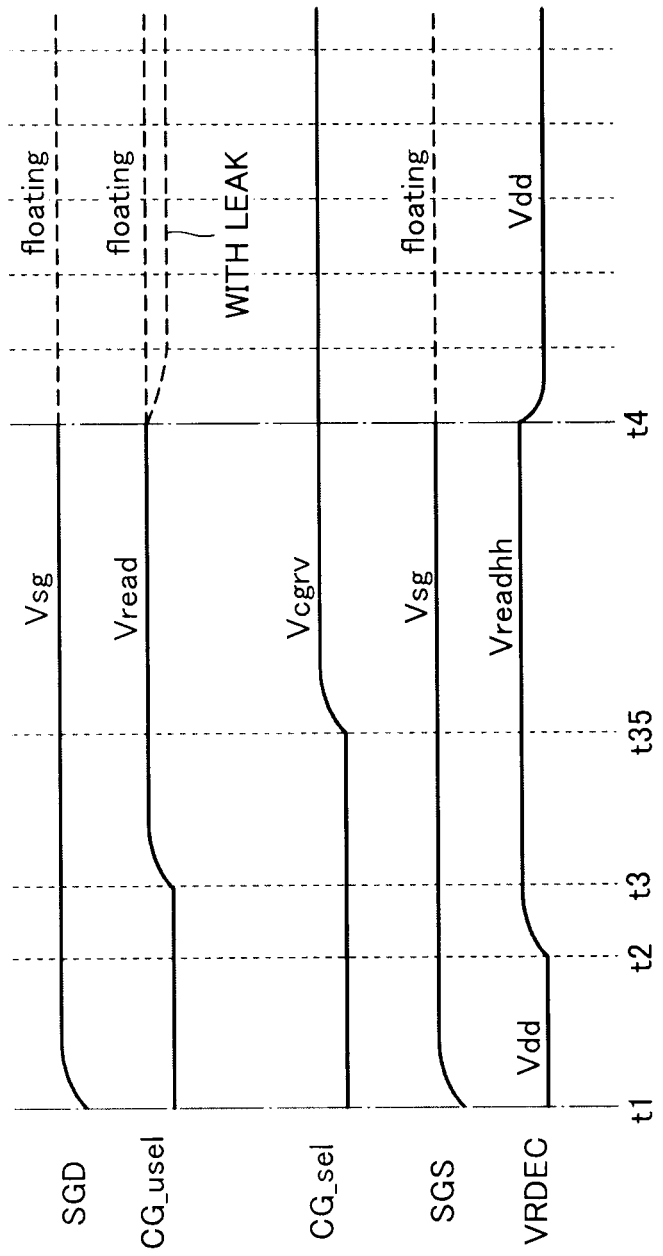
FIG. 10 is a timing chart illustrating an operation of the nonvolatile semiconductor memory device according to the fourth embodiment.

Next, A NAND type flash memory according to the fourth embodiment is described with reference to FIG. 10. This embodiment is similar to the above-described embodiments in that it detects a leak state of the word lines WL by setting the word lines WL in floating state. As shown in FIG. 10, however, this embodiment is different from the above-described embodiments in that a voltage value of the voltage VRDEC is reduced to the power supply voltage Vdd at time t4, rather than to 0 V. Accordingly, the word lines WL provided with the voltage Vread, and the select gate lines SGD, SGS provided with the voltage Vsg (>Vread) is switched to a floating state. In contrast, the word line WL provided with the voltage Vcgrv (=0V) which is lower than a voltage of Vdd-Vth does not switch to a floating state, and continues to be provided with the voltage Vcgrv.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in the above-mentioned embodiments, explanations are made where a memory cell adjacent to a select gate transistor is a dummy cell. However, the present invention is not limited to this. It is possible that no dummy cell is provided in the memory string, but all memory cells in a memory string may be normal cells used for storing data.

Furthermore, in the above-described embodiments, checker-pattern data as test data is written to the memory cell array, and then test read is performed. The checker pattern data is written into the memory cell array such that data "0" is written to either one of the odd-numbered or even-numbered memory cells, while data "1" is written to the other one of the odd-numbered or even-numbered memory cells. After that, another set of test pattern data in which all of "1" are replaced by "0", while all of "0" are replaced by "1" is written into the memory cell array, and then test read is performed. However, the present invention is not limited to this. For example, it is possible to provide test pattern data in which one memory cell out of three memory cells may be written with data "0", while the other two memory cells may be written with data "1".

In short, the formation of test pattern data is not limited to specific ones, as long as the word lines WL and the like may be set in a floating state, and thereafter a conductive state of the memory cell may be detected after a lapse of a certain wait time.

What is claimed is:

1. A nonvolatile semiconductor memory device, comprising:
   a memory cell array including a plurality of blocks arranged therein, each of the blocks including therein an aggregate of NAND cell units, each of the NAND cell units including therein memory strings, first and second select gate transistors connected to both ends of the memory string respectively, each of the memory string including therein a plurality of nonvolatile memory cells connected in series;
   word lines each commonly connected to control gates of the memory cells arranged along a first direction;
   first and second select gate lines each commonly connected to gates of the first or second select gate transistors arranged along the first direction;
   bit lines each connected to a first end of the NAND cell unit;
   a source line connected to a second end of the NAND cell unit;
   a sense amplifier circuit configured to detect a potential of the bit lines to determine data stored in the memory cells;
   a voltage control circuit configured to control voltages to be provided to the word lines, and the first and second select gate lines,
   transfer transistors configured to switch a connection state between the voltage control circuit and the word lines, the first select gate line, and second select gate line; and
   a control circuit configured to control the voltage control circuit, the transfer transistors and the sense amplifier circuit,
   the control circuit being configured to, when performing a word line leak test to determine a leak state of the word lines,
   apply, from the voltage control circuit to the word lines connected to the memory cell array written with test pattern data, voltages corresponding to the test pattern data,
   thereafter switch the transfer transistors to a nonconductive state, thereby setting the word lines in a floating state,
   after a lapse of a certain time from switching of the transfer transistors to a nonconductive state, activate the sense amplifier circuit to perform a read operation in the memory cell array, and
   compare a result of the read operation with an expectation value corresponding to the test pattern data.

2. The nonvolatile semiconductor memory device according to claim 1, wherein the sense amplifier circuit further includes a data buffer configured to hold data read by the word line leak test.

3. The nonvolatile semiconductor memory device according to claim 1, wherein
   among the memory cells in the memory string, a memory cell adjacent to the first or second select gate transistor is a dummy cell not used in for storing data.

4. The nonvolatile semiconductor memory device according to claim 3, wherein

When the read operation is performed, the control circuit applies, to a dummy word line connected to the dummy cell, a read pass voltage that can turn on a memory cell regardless of data stored therein.

5. The nonvolatile semiconductor memory device according to claim 3, wherein
When the read operation is performed, the control circuit applies, to a dummy word line connected to the dummy cell, the same voltage as a voltage applied to the first and second select gate lines.

6. The nonvolatile semiconductor memory device according to claim 1, wherein
a piece of the test pattern data is either one of first data corresponding to the first threshold voltage distribution or second data corresponding to the second threshold voltage distribution that is higher than the first threshold voltage distribution, and
the control circuit applies a first voltage between first threshold voltage distribution and the second threshold voltage distribution to the word line connected to the memory cell to which the first data is written, and applies a second voltage that is larger than the upper limit of the second threshold voltage distribution to the word line connected to the memory cell to which the second data is written, and then switches the transfer transistors to a nonconductive state, thereby setting the word lines in a floating state.

7. The nonvolatile semiconductor memory device according to claim 6, wherein
among the memory cells in the memory string, a memory cell adjacent to the first or second select gate transistor is a dummy cell not used in for storing data.

8. The nonvolatile semiconductor memory device according to claim 7, wherein
When the read operation is performed, the control circuit applies, to a dummy word line connected to the dummy cell, a read pass voltage that can turn on a memory cell regardless of data stored therein.

9. The nonvolatile semiconductor memory device according to claim 7, wherein
When the read operation is performed, the control circuit applies, to a dummy word line connected to the dummy cell, the same voltage as a voltage applied to the first and second select gate lines.

10. The nonvolatile semiconductor memory device according to claim 1, wherein
the control circuit performs a first test operation after writing first data corresponding to a first threshold voltage distribution to even-numbered memory cells in the memory string, as the test pattern data, while writing second data corresponding to a second threshold voltage distribution to odd-numbered memory cells, as the test pattern data, the second threshold voltage distribution being higher than the first threshold voltage distribution, and performs a second test operation after writing the first data to the odd-numbered memory cells in the memory string, as the test pattern data, while writing second data to the even-numbered memory cells, as the test pattern data.

11. The nonvolatile semiconductor memory device according to claim 10, wherein
among the memory cells in the memory string, a memory cell adjacent to the first or second select gate transistor is a dummy cell not used in for storing data.

12. The nonvolatile semiconductor memory device according to claim 10,
wherein during the first test operation, the control circuit applies a first voltage between the first threshold voltage distribution and the second threshold voltage distribution to word lines connected to the even-numbered memory cells, while applies a second voltage larger than the upper limit of the second threshold voltage distribution to word lines connected to the odd-numbered memory cells, and
during the second test operation, the control circuit applies the first voltage to word lines connected to the odd-numbered memory cells, while applies the second voltage to word lines connected to the even-numbered memory cells.

13. The nonvolatile semiconductor memory device according to claim 1, wherein
among the memory cells in the memory string, a memory cell adjacent to the first or second select gate transistor is a dummy cell not used in for storing data, and
a dummy word line connected to the dummy cell is provided with a voltage different from a voltage applied to a word line adjacent to the dummy word line.

14. The nonvolatile semiconductor memory device according to claim 1, wherein
the control circuit switches a voltage applied to the transfer transistors from a first voltage to a second voltage, thereby maintaining the transfer transistor transferring a voltage smaller than the second voltage by a certain voltage in a conducting state.

15. A method of testing a nonvolatile semiconductor memory device, the device comprising: a memory cell array including a plurality of blocks arranged therein, each of the blocks including therein an aggregate of NAND cell units, each of the NAND cell units including therein memory strings, first and second select gate transistors connected to both ends of the memory string respectively, each of the memory string including therein a plurality of nonvolatile memory cells connected in series; word lines each commonly connected to control gates of the memory cells arranged along a first direction; first and second select gate lines each commonly connected to gates of the first or second select gate transistors arranged along the first direction; bit lines each connected to a first end of the NAND cell unit; a source line connected to a second end of the NAND cell unit; a sense amplifier circuit configured to detect a potential of the bit lines to determine data stored in the memory cells; a voltage control circuit configured to control voltages to be provided to the word lines, and the first and second select gate lines; and transfer transistors configured to switch a connection state between the voltage control circuit and the word lines, the first select gate line, and second select gate line,
the method comprising:
writing test pattern data to the memory cell array;
after applying a voltage corresponding to the test pattern data to word lines connected to the memory cell array written with the test pattern data, switching the transfer transistors to a nonconductive state, thereby setting the word lines in a floating state;
after a lapse of a certain time from switching of the transfer transistors to a nonconductive state, activating the sense amplifier circuit to perform a read operation in the memory cell array; and
comparing a result of the read operation with an expectation value corresponding to the test pattern data.

16. The method of testing according to claim 15, further comprising:
performing a first test operation by executing a voltage application operation, and the read operation after writing first data corresponding to a first threshold voltage distribution to even-numbered memory cells in the memory string, as the test pattern data, while writing second data corresponding to a second threshold voltage distribution to odd-numbered memory cells, as the test pattern data, the second threshold voltage distribution being higher than the first threshold voltage distribution; and performing a second test operation by executing a voltage application operation, and the read operation after writing the first data to the odd-numbered memory cells in the memory string, as the test pattern data, while writing second data to the even-numbered memory cells.

17. The method of testing according to claim 16, wherein during the first test operation, a first voltage between the first threshold voltage distribution and the second threshold voltage distribution is applied to word lines connected to the even-numbered memory cells, while a second voltage larger than the upper limit of the second threshold voltage distribution is applied to word lines connected to the odd-numbered memory cells, and during the second test operation, the first voltage is applied to word lines connected to the odd-numbered memory cells, while the second voltage is applied to word lines connected to the even-numbered memory cells.

18. The method of testing according to claim 15, wherein among the memory cells in the memory string, a memory cell adjacent to the first or second select gate transistor is a dummy cell not used in for storing data, and a dummy word line connected to the dummy cell is provided with a voltage different from a voltage applied to a word line adjacent to the dummy word line.

19. The method of testing according to claim 15, wherein a voltage applied to the transfer transistors is switched from a first voltage to a second voltage, thereby maintaining the transfer transistor transferring a voltage smaller than the second voltage by a certain voltage in a conducting state.

20. The method of testing according to claim 15, wherein a piece of the test pattern data is either one of first data corresponding to the first threshold voltage distribution or second data corresponding to the second threshold voltage distribution that is higher than the first threshold voltage distribution, and a first voltage between first threshold voltage distribution and the second threshold voltage distribution is applied to the word line connected to the memory cell to which the first data is written, and a second voltage that is larger than the upper limit of the second threshold voltage distribution is applied to the word line connected to the memory cell to which the second data is written, and then the transfer transistors is switched to a nonconductive state, thereby setting the word lines in a floating state.

* * * * *